United States Patent [19]

Maben et al.

[11] Patent Number: 5,012,131

[45] Date of Patent: Apr. 30, 1991

[54] POWER SUPPLY NOISE COMPENSATION FOR A HIGH FREQUENCY PHASE DETECTOR

[75] Inventors: James W. Maben, Brookline; Raymond G. Brown, Nashua, both of N.H.

[73] Assignee: Sanders Associates, N.H.

[21] Appl. No.: 286,597

[22] Filed: Dec. 19, 1988

[51] Int. Cl.$^5$ .......................... H03K 3/01; H03K 5/00
[52] U.S. Cl. ................................ 307/296.4; 307/542; 328/155
[58] Field of Search ...................... 307/296.4, 262, 520, 307/542; 328/133, 155, 165; 363/148, 3, 4; 323/217, 218

[56] References Cited

U.S. PATENT DOCUMENTS

| | | | |
|---|---|---|---|
| 3,171,982 | 3/1965 | Ruhland | 307/296.6 |
| 3,484,702 | 12/1969 | Moore | 307/296.6 |
| 3,612,917 | 10/1971 | Sutcliffe et al. | 307/296.6 |
| 3,622,864 | 11/1971 | Claps et al. | 307/296.6 |
| 3,673,430 | 6/1972 | Donoghue | 307/296.6 |

Primary Examiner—Stanley D. Miller
Assistant Examiner—Richard Roseen
Attorney, Agent, or Firm—Nutter, McClennen & Fish

[57] ABSTRACT

A phase detector circuit which compensates for unwanted variations induced in an input signal by the operation of a thresholding input circuit such as a frequency divider. The circuit monitors the level of a supply voltage used by the input circuit to provide a supply variation signal indicative of such unwanted variations. The supply variation signal is then used to correct the output of the input circuit. In one embodiment that compensates for noise in the output of a digital frequency divider used as an input circuit in a high frequency phase detector, a high-pass filter and amplifier detect the supply variations. The supply variation signal is then fed to a phase adjustment circuit which compensates for the variations in supply voltage by adjusting the conduction threshold of a differential transistor pair. A variable impedance can be arranged to optimally attenuate the supply variation signal, thereby obtaining maximum noise elimination at a given operation frequency. The invention can be useful wherever an input signal is compared against a threshold voltage.

16 Claims, 3 Drawing Sheets

POWER SUPPLY NOISE COMPENSATION FOR A HIGH FREQUENCY PHASE DETECTOR

FIELD OF THE INVENTION

This invention relates generally to noise compensation, and particularly to a circuit which compensates a comparator for power-supply induced noise.

BACKGROUND OF THE INVENTION

Many electronic systems use comparators to determine various parameters of an input signal. For example, a phase detector circuit measures the phase of the input signal by comparing it to a local reference signal. However, in certain applications, such as very high frequency phase detectors, phase modulation receivers, frequency synthesizers, spectrum analyzers, and the like, the input signal must first be processed by an input circuit before it is fed to the comparator. The input circuit may be one of several types. For example, in the case of a high frequency phase detector, the input circuit may be a digital frequency divider; in the case of a phase modulation receiver, the input circuit may be a demodulator.

Unfortunately, if the input circuit is particularly susceptible to perturbations of various types, an inaccurate indication of the input signal's parameters can result. Such perturbations may originate as inherent thermal noise in the semiconductor junctions of the comparator, or may also originate in the input signal itself, as variations in zero crossing time.

The system power supply can also be a major source of noise. If careful attention is not paid to component layout and ground wire placement, for example, power supply voltage distribution lines tend to act as antennas. The distribution lines thus receive radiation from operating system components, especially switching components such as digital logic circuits. The received radiation manifests itself as variations in the supply voltage, which may then be directly transferred to the input signal by the operation of the input circuit. These unwanted variations in the input signal in turn cause inaccuracies in the indication of its parameters.

SUMMARY OF THE INVENTION

It is a general object of this invention to increase the sensitivity of electrical comparator circuits.

Another object is to improve the accuracy of high frequency phase detectors by correcting for power supply-induced noise.

A further object is to improve the sensitivity of input signal parameter measuring circuits in applications where an input signal must first be processed by a input circuit which may induce unwanted variations in the input signal.

Briefly, these and other objects are accomplished by compensating for variations in the level of a supply voltage used by an input circuit. The supply voltage is monitored to produce a supply variation signal which is indicative of such variations. The supply variation signal is then used to correct the output of the input circuit.

More particularly, in one embodiment which compensates for noise in the output of a digital frequency divider used as an input circuit in a high frequency phase detector, a high-pass filter and amplifier detect variations in the power supply voltage, providing a supply variation signal. The supply variation signal is then fed to a phase adjustment circuit. The phase adjustment circuit compensates for variations in power supply voltage by adjusting the conduction threshold of a differential transistor pair. A variable resistor is arranged to optimally attenuate the supply variation signal, thereby obtaining maximum noise elimination for a given operation frequency.

In circuits which must operate over a broad bandwidth, such as phase locked loops, noise compensation is required over a range of frequencies. In such cases, the variable resistor is replaced by a broadband compensating network.

The invention significantly reduces errors in a high frequency phase detector circuit which is susceptible to variations in power-supply voltage. However, the invention can be useful wherever an input signal is compared against a threshold voltage.

BRIEF DESCRIPTION OF THE DRAWINGS

This invention is pointed out with particularity in the appended claims. The above and further advantages of the invention may be better understood by referring to the following detailed description and the accompanying drawings, in which:

DETAILED DESCRIPTION OF AN ILLUSTRATIVE EMBODIMENT

Figure 1:
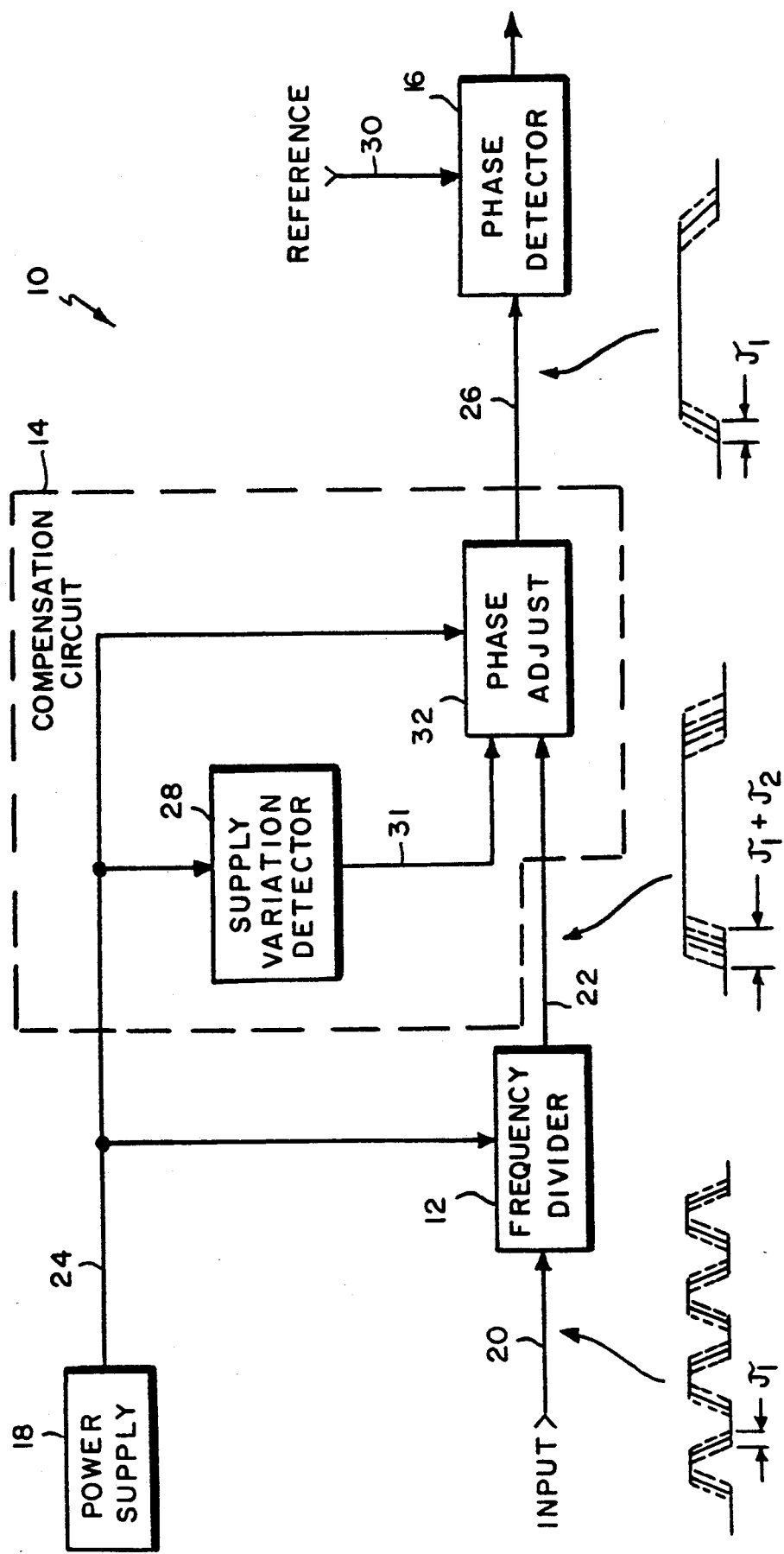
FIG. 1 is a block diagram of a compensation circuit according to the invention.

For purposes of illustration, this invention will be described in connection with a high-frequency phase measurement system in which even minute variations in supply voltage can cause substantial measurement errors. Referring to the drawings more particularly, where like reference numbers designate corresponding parts throughout the several figures, FIG. 1 shows a high frequency measurement system 10 which uses a phase detector 16 for measuring the phase of an input signal 20 with respect to a reference signal 30. The illustrated phase measurement system 10 includes a frequency divider 12, a compensation circuit 14, phase detector circuit 16, and a power supply 18. As will be described later in greater detail, the nature of measurement system 10 is such that a phase-sensitive input circuit, such as the frequency divider 12, must operate on the very high frequency input signal 20 before the input signal 20 can be processed by parameter measurement circuits such as the phase detector 16.

Thus, frequency divider 12 produces an intermediate signal 22 which contains signal components that relate directly to the phase of the input signal 20. Unfortunately, the intermediate signal 22 also contains noise components contributed by the power supply 18. These noise components are added to intermediate signal 22 via a supply voltage signal 24 used to provide power to the frequency divider.

In accordance with the invention, compensation circuit 14 then operates on the intermediate signal 22 to produce a compensated signal 26. Compensated signal 26 has signal components relating only to the phase of the input signal 20, and not the noise components contributed by power supply 18. The relative phase of the compensated signal 26, and hence the input signal 20, is thus more accurately determined when the phase detector 16 compares it to the reference signal 30.

In other words, the compensation circuit 14 allows the phase detector 16 to more accurately determine the relative phase of the input signal 20, since the compensation circuit 14 of the invention removes inaccuracies that might otherwise be contributed by noise components from the power supply 18.

Figure 2:
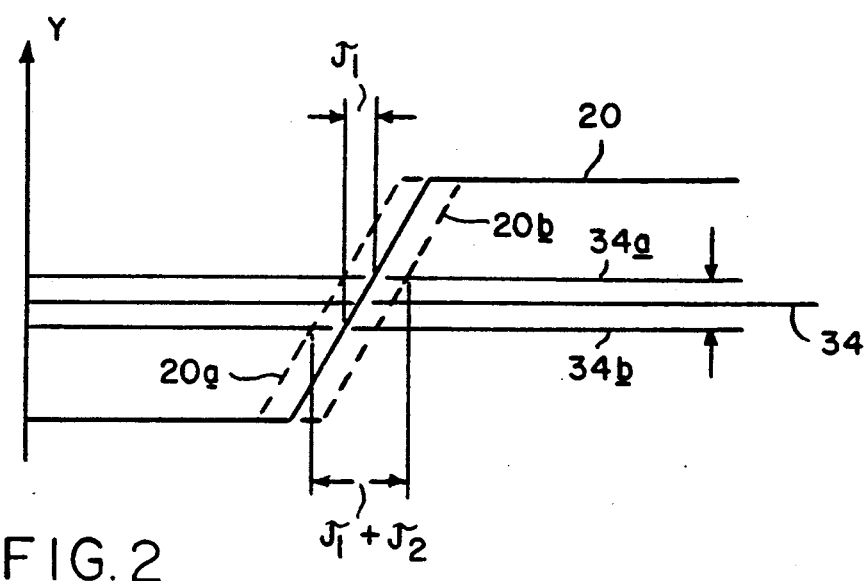
FIG. 2 depicts the situation wherein the phase-sensitive circuit depicted in FIG. 1 is a typical thresholding device.

FIG. 2 illustrates more particularly the source of unwanted variation causing the phase uncertainty. The typical frequency divider 12 includes a thresholding device such as a detector diode, comparator, or a digital logic circuit. The thresholding device operates by comparing the amplitude of input signal 20 to a threshold voltage 34.

Variations in the phase of input signal 20 are thus manifested as variations in the time that input signal 20 exceeds the threshold voltage 34. In normal operation the rising edge of input signal 20 may occur at an earlier time, such as illustrated by the waveform 20a, or at a later time, as indicated by waveform 20b. The possible range of time over which input signal 20 can cross the threshold voltage 34 is indicated by the interval $\tau_1$.

However, this assumes that the threshold voltage 34 remains constant. In reality, that is not the case. Variations in the supply voltage from power supply 18 cause variations in the instantaneous value of the threshold voltage 34. The result is that threshold voltage 34 will vary between a high amplitude 34a and a low amplitude 34b. This in turn means that the time at which input signal 20 crosses the threshold voltage 34 also varies over a wider range, $\tau_1 + \tau_2$. These variations in the supply voltage 24 cause the threshold voltage 34 to move, providing a false reading of the phase of the input signal 20.

The exemplary signal traces in FIG. 1 show how this is propagated through the system 10 to cause an error in the phase measurement process, and how the invention corrects the error. In the illustrated example, input signal 20 is a digital phase-modulated signal which contains phase information in the relative time position of its logic-state transitions. Thus, the instantaneous position of a state transitions within the time interval $\tau_1$ determines the phase of input signal 20. However, frequency divider 12 adds an additional uncertainty to this time interval, so that the total uncertainty in the position of a transition in intermediate signal 22 is $\tau_1 + \tau_2$. By operation of compensation circuit 14, the addition uncertainty over the period $\tau_2$ is removed, so that the variations in transitions of compensated signal 26 occur only over the original interval $\tau_1$.

Still referring to FIG. 1, compensation circuit 14 typically includes a supply variation detector 28 and a phase adjustor 32. Detector 28 detects the alternating current (AC) components of the supply voltage 24. The output signal 31 from detector 28 and intermediate signal 22 are then forwarded to phase adjustor 32. Adjustor 32 adjusts the intermediate signal 22 to remove the unwanted variations in the phase of intermediate signal 22 included by power supply 18.

In particular, variation detector 28 provides a variation output signal 31 which represents the variations in the supply voltage 24. Phase adjustor 32 then compensates for these variations by subtracting the variation output signal 31 from the intermediate signal 22. Equivalently, of course, variation signal detector 28 can supply an inverted representation of the variations in supply voltage 24, and phase adjustor 32 can simply add the inverted variations to the intermediate signal.

Figure 3:
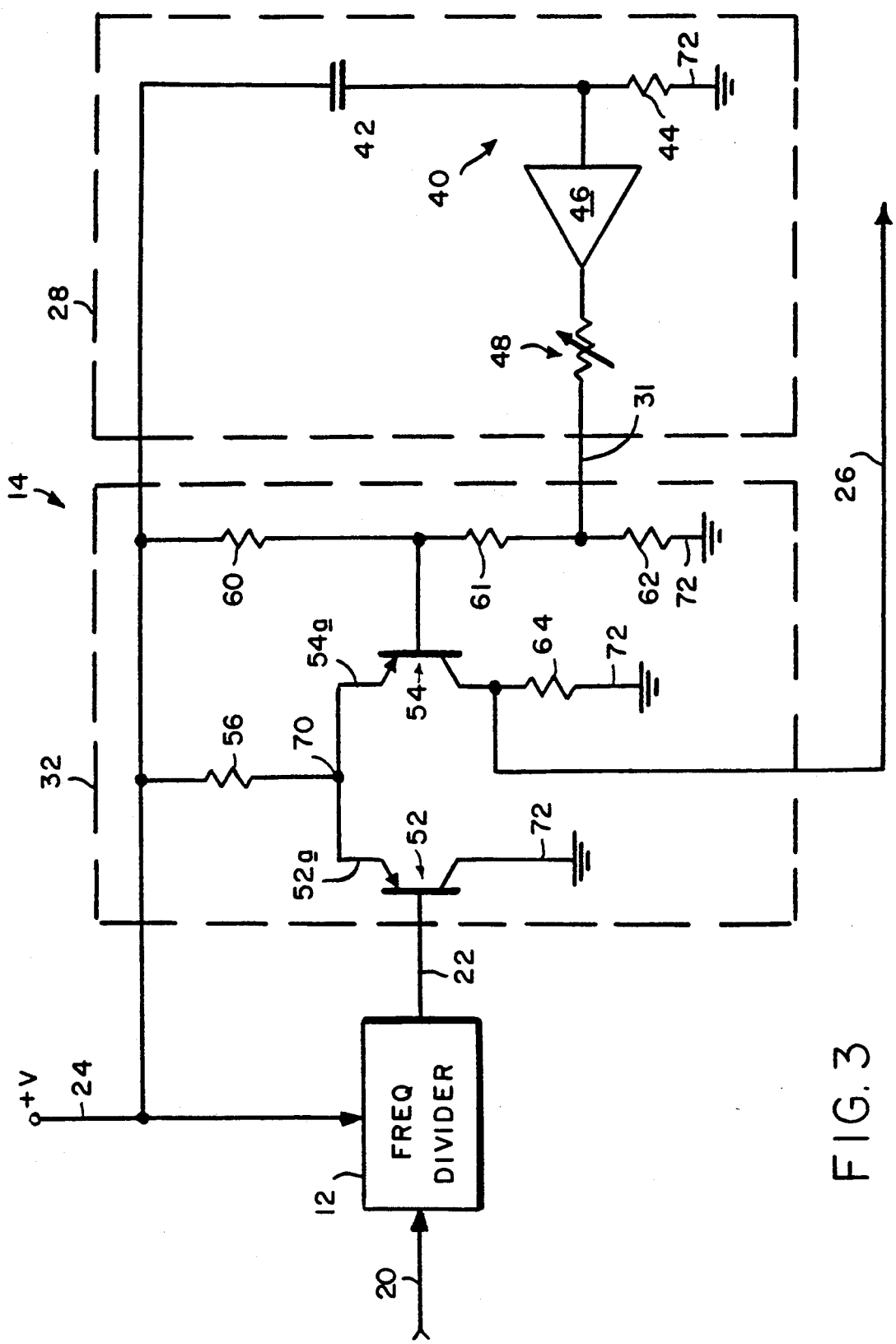
FIG. 3 is a circuit diagram of one embodiment of the compensation circuit as used with a frequency divider.

FIG. 3 shows one embodiment of compensation circuit 14 constructed for use in a the high frequency phase detector. The frequency divider 12 in this situation is a digital frequency divider, so that it provides an intermediate signal 22 which has an average frequency which is an exact subharmonic of the frequency of input signal 20. The digital frequency divider 12 includes one or more digital bi-stable flip-flops which, like all digital circuits, include thresholding devices (not shown) which compare the input signal 20 against a voltage derived from the value of the supply voltage 24.

Here supply variation detector 28 first operates on supply voltage signal 24 by passing it through a high pass filter shown for purposes of illustration as a series capacitor 42 and shunt resistor 44. The output of high pass filter 40 is then forwarded to an amplifier 46 which provides the output signal 31 of variation detector 28. The output signal 31 has a magnitude equal to the unwanted variations in supply voltage 24 but an opposite phase.

The amplitude of variation detector output 31 is adjusted by compensator 48 in order to minimize the output phase variations of the phase adjustor 32. While in the illustrated circuit compensator 48 was constructed using a variable resistor, which is sufficient for frequency divider 12 to optimally operate at a single frequency, it is understood that compensator 48 can also be a broadband compensation network which provides the desired amplitude and phase correction over a range of operating frequencies.

The phase adjustor 32 consists of a common-emitter differential transistor pair; transistors 52, 54; emitter resistor 56; base biasing resistors 60, 61, and 62; and collector resistor 64. The emitters 52a and 54a, respectively, of transistors 52 and 54 are connected to one terminal of the emitter resistor 56 at an emitter node 70. The other terminal of emitter resistor 56 is coupled to receive the supply voltage signal 24. The base of transistor 52 receives the intermediate signal 22, while the collector of transistor 52 is tied to a ground reference node 72. Ground reference node 72 is coupled to a ground reference output of the power supply 18 (not shown in FIG. 3).

The biasing resistors 60, 61, and 62 form a resistive voltage divider network to attenuate the amplitude of variation detector output 31 as it is passed to the base of transistor 54. The relative resistance values of these biasing resistors are also chosen so that the nominal supply voltage 24 places the voltage at the base of transistor 54 at the midpoint between the logic zero (or lowest expected) and logic one voltage (or highest expected) voltages on intermediate signal 22 applied to the base of transistor 52. The compensated signal 26 is taken from the collector of transistor 54. The resistance of collector resistor 64, coupled between the collector of transistor 54 and ground reference 72, is chosen to provide the proper output impedance.

The operation of the circuit of FIG. 3 can be understood by considering what occurs as the intermediate signal 22 transitions from a logic low to a logic high voltage. When this occurs, the current at the emitter of transistor 52 decreases, causing the voltage at emitter node 70 to rise. As the voltage at emitter node 70 rises, current flow out of the base of transistor 54 also rises. When this current is sufficiently large, transistor 54 turns on, thereby increasing the output voltage at the collector of transistor 54.

The point at which transistor 54 turns on is, of course, determined by the voltage at the base of transistor 54. This voltage is adjusted by the variation detector output 31 and the resistor divider network, which present a voltage which varies in accordance with the variations in the supply voltage 24. Thus, it is seen than variations in the value of supply voltage 24 are counteracted by the application of the variable part of this voltage to the base of transistor 54.

Figure 4:
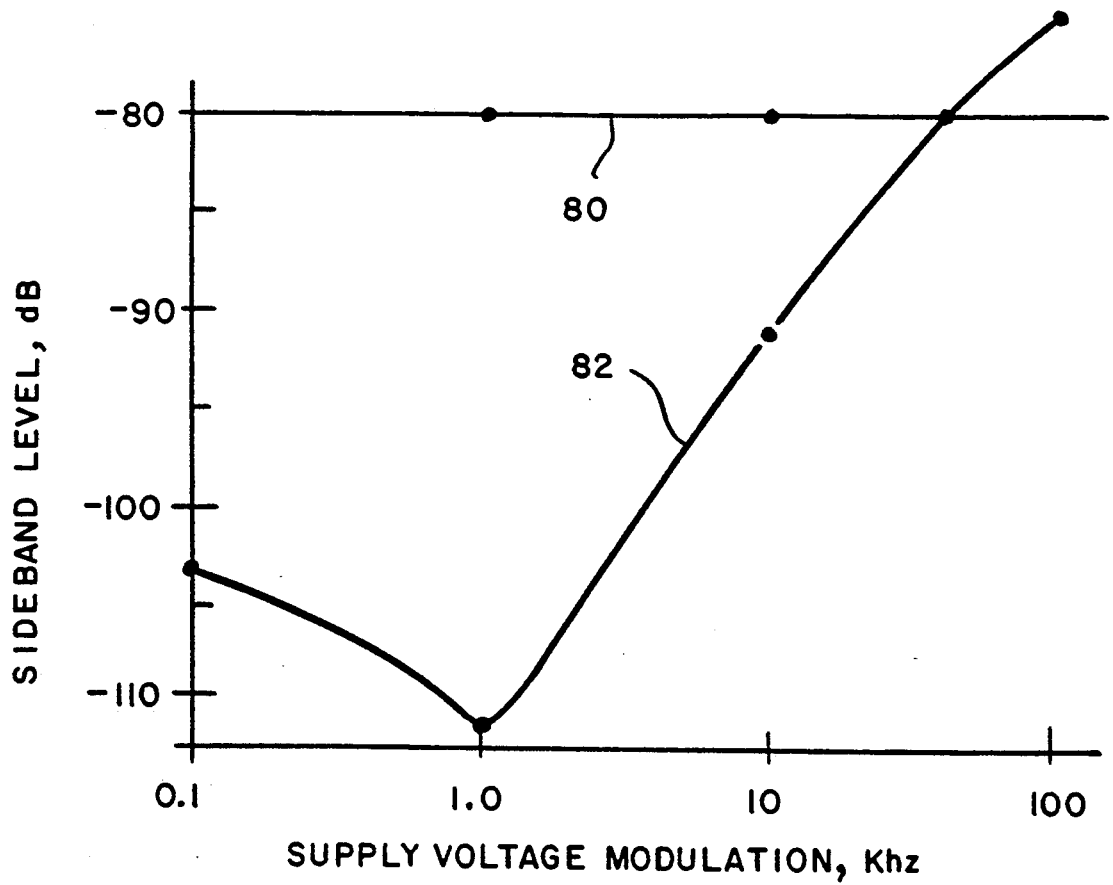
FIG. 4 is a frequency response diagram showing the sensitivity improvement possible by using the circuit of FIG. 3.

An illustration of the improvement achievable with the circuit of FIG. 3 appears in FIG. 4, which shows the sideband amplitude level in decibels (dB) at the first harmonic of the output of the frequency divider 12 as a function of the variations in the supply voltage 24. These variations were induced as a continuous frequency signal ranging from 0.1 khz to 100 khz. The upper curve 80 shows the measured sideband level in the absence of compensation circuit 14. Note that this remained approximately constant over the illustrated range, at −80 dB.

With the addition of a compensation circuit 14 having its amplitude compensator 48 resistor adjusted to maximize elimination of noise at the frequency of 1 khz, a 30 dB improvement is seen in the lower curve 82.

The foregoing description has been limited to a specific embodiment of this invention. It will be apparent, however, that variations and modifications may be made to the invention, with the attainment of some or all of the advantages of the invention.

The invention can also be used in other applications having phase-sensitive input circuits other than a frequency divider 12. These phase-sensitive input circuits may by one of several different types, depending upon the particular application for system 10. For example, if system 10 is a receiver and input signal 20 an analog signal, the phase of input signal 20 cannot be directly measured in some instances, such as when input signal 20 is a high-frequency modulated signal. In those instances, the phase-sensitive circuit is typically a detector (or demodulator).

Regardless of the application, what distinguishes the input circuit is that it is connected to the power supply 18 and performs a comparison or thresholding operation on the input signal 20, in such a way that unwanted variations in the supply voltage 24 cause unwanted variations in the intermediate signal 22. If this is the case, then the invention can be used advantageously.

Therefore, it is the object of the appended claims to cover all such variations and modifications as come within the true spirit and scope of the invention.

What is claimed is:

1. An apparatus which compensates for errors in the time position of state transitions which occur in a signal output from a digital frequency divider, the errors in the digital frequency divider originating as variations in a power supply voltage connected to provide power to the digital frequency divider, the apparatus comprising:
    A. detecting means, for detecting variations in the power supply voltage, and for providing a detected variations signals;
    B. a differential transistor pair, receiving the detected variations signal at a first one of the transistors, and receiving the digital frequency divider output signal at a second one of the transistors, and the differential transistor pair providing a compensated signals corresponding to the digital frequency divider output signal having the detected variation in the power supply voltage removed; and
    C. compensation network means, connected between the detecting means and the differential transistor pair, for adjusting the compensated signal for impedance variations as the operating frequency of the frequency divider changes.

2. Apparatus as in claim 1 wherein the detecting means additionally comprises a high pass filer.

3. Apparatus as in claim 2 wherein the detecting means additionally comprises an amplifier means, connected to the high pass filter, for providing the defected variations signal.

4. Apparatus as in claim 1 wherein the compensation network means is a variable resistor.

5. Apparatus as in claim 1 wherein the compensation network means is a broadband compensation network.

6. A phase detector apparatus for measuring the phase of an input signal with respect to a reference signal, the apparatus comprising:
    A. means for providing a supply voltage;
    B. a phase sensitive input circuit, receiving the input signal and the supply voltage, and providing an intermediate signal, the intermediate signal having phase variations induced by variations in the supply voltage;
    C. a supply variation detector, receiving the supply voltage, and providing a supply variation signal indicative of variations in the supply voltage;
    D. phase adjustment means, for adjusting values of the intermediate signal in accordance with values of the supply variation signal, and for providing an adjusted signal; and
    E. phase detector means, for receiving the adjusted signal and the reference signal, and for providing an output signal indicative of the phase difference between the adjusted signal and the reference signal.

7. Apparatus as in claim 6 wherein the input circuit is a digital frequency divider.

8. Apparatus as in claim 6 wherein the supply variation detector is a high pass filter.

9. Apparatus as in claim 6 wherein the phase adjustment means additionally comprises:
    E. a differential amplifier, receiving the intermediate signal, and the supply variation signal, the amplifier configured so that it provides the adjusted signal at an amplifier output.

10. Apparatus as in claim 9 wherein the differential amplifier additionally comprises:
    F. a first transistor, having the intermediate signal coupled to its base terminal, the supply voltage coupled to its emitter terminal, and a ground reference signal coupled to its collector terminal; and
    G. a second transistor, having the supply variation signal coupled to its base terminal, the supply voltage coupled to its emitter terminal, and arranged to provide the adjusted signal at its collector terminal.

11. Apparatus as in claim 6 additionally comprising:
    H. a variable resistor for matching the output impedance of the supply variation detector to the input impedance of the phase adjustment means, thereby obtaining maximum noise elimination at a given operating frequency.

12. Apparatus as in claim 6 additionally comprising:

I. a broadband compensating network for matching the output impedance of the supply variation detector to the input impedance of the phase adjustment means, thereby obtaining maximum noise elimination over a range of operating frequencies.

13. Apparatus as in claim 6 wherein the phase sensitive input circuit includes a thresholding means for deriving a threshold voltage from the supply voltage, for comparing the input signal to the threshold voltage, and for generating the intermediate signal in response to the comparison.

14. Apparatus as in claim 8 wherein the supply variation detector additionally comprises an amplifier means, connected to the high pass filter, for providing the supply variation signal.

15. Apparatus as in claim 10 additionally comprising:
J. a resistive biasing network, connected to the base of the second transistor, for biasing the base of the transistor at a midpoint between a lowest expected voltage and a highest expected voltage when the supply voltage is at a nominal value.

16. An apparatus for measuring the phase of a high-frequency input signal with respect to a reference signal, the apparatus comprising:
A. means for providing a supply voltage;
B. a digital frequency divider, connected to receive the input signal and the supply voltage, and connected to provide an intermediate signal having a frequency corresponding to a subharmonic of the input signal frequency, the intermediate signal having phase variations induced by variations in the supply voltage;
C. a high pass filter, connected to receive the supply voltage, and to provide a supply variation signal indicative of variations in the supply voltage;
D. a differential transistor pair, comprising:
  i. a first transistor, having the intermediate signal coupled to its base terminal, the supply voltage coupled to its emitter terminal, and a ground reference signal coupled to its collector terminal; and
  ii. a second transistor, having the supply variation signal coupled to its base terminal, the supply voltage coupled to its emitter terminal, and arranged to provide an adjusted signal at its collector terminal;
the adjusted signal provided by the differential transistor pair corresponding to the intermediate signal with the variations in the supply voltage removed; and
E. phase detector means, for receiving the adjusted signal and the reference signal, and for providing an output signal indicative of the phase difference between the adjusted signal and the reference signal.

* * * * *